United States Patent
Sabharwal et al.

(10) Patent No.: US 7,061,794 B1
(45) Date of Patent: Jun. 13, 2006

(54) WORDLINE-BASED SOURCE-BIASING SCHEME FOR REDUCING MEMORY CELL LEAKAGE

(75) Inventors: Deepak Sabharwal, New Delhi (IN); Alexander Shubat, Fremont, CA (US)

(73) Assignee: Virage Logic Corp., Fremont, CA (US)

( * ) Notice: Subject to any disclaimer, the term of this patent is extended or adjusted under 35 U.S.C. 154(b) by 182 days.

(21) Appl. No.: 10/813,419

(22) Filed: Mar. 30, 2004

(51) Int. Cl.
  *G11C 11/00* (2006.01)
  *G11C 7/00* (2006.01)

(52) U.S. Cl. ............. 365/154; 365/189.09; 365/230.02
(58) Field of Classification Search ............... 365/154, 365/203, 189.09, 230.02, 230.06
See application file for complete search history.

(56) References Cited

U.S. PATENT DOCUMENTS

| | | | |
|---|---|---|---|
| 6,172,901 B1 * | 1/2001 | Portacci ................ | 365/154 |
| 6,181,608 B1 * | 1/2001 | Keshavarzi et al. ........ | 365/188 |
| 6,515,893 B1 * | 2/2003 | Bhavnagarwala ........... | 365/154 |
| 6,920,060 B1 * | 7/2005 | Chow et al. ............... | 365/145 |
| 2003/0012048 A1 * | 1/2003 | Chappell et al. ............ | 365/154 |
| 2003/0081492 A1 * | 5/2003 | Farrell et al. ............ | 365/238.5 |
| 2005/0128789 A1 * | 6/2005 | Houston ..................... | 365/154 |

OTHER PUBLICATIONS

Kenichi Osada et al.; "16.7fA/cell Tunnel-Leakage-Suppressed 16MB SRAM for Handling Cosmic-Ray-Induced Multi-Errors"; 2003 IEEE International Solid-State Circuits Conference; pp. 302-303.

* cited by examiner

*Primary Examiner*—Tuan T. Nguyen
*Assistant Examiner*—Dang Nguyen
(74) *Attorney, Agent, or Firm*—Danamraj & Youst, P.C.

(57) ABSTRACT

A source-biasing mechanism for leakage reduction in SRAM. In standby mode, wordlines are deselected and a source-biasing potential is provided to SRAM cells. In read mode, a selected wordline deactivates the source-biasing potential provided to the selected row of SRAM cells, whereas the remaining SRAM cells on the selected bitline column continue to be source-biased.

30 Claims, 6 Drawing Sheets

WORDLINE-BASED SOURCE-BIASING SCHEME FOR REDUCING MEMORY CELL LEAKAGE

BACKGROUND OF THE INVENTION

1. Technical Field of the Invention

The present invention relates generally to semiconductor memories. More particularly, and not by way of any limitation, the present invention is directed to a wordline-based source-biasing scheme for reducing leakage in Static Random Access Memory (SRAM) cells.

2. Description of Related Art

Static Random Access Memory or SRAM devices comprising a plurality of memory cells are typically configured as an array of rows and columns, with one or more I/Os (i.e., ×4, ×8, ×16, etc. configurations). Also, such memories may be provided in a multi-bank architecture for applications where high density, high speed and low power are required. Regardless of the architecture and type, each SRAM cell is operable to store a single bit of information. Access to this information is facilitated by activating all memory cells in a given row (by driving a wordline associated therewith) and outputting the data onto bitlines associated with a selected column for providing the stored data value to the selected output. Once the data is disposed on the bitlines, voltage levels on the bitlines begin to separate to opposite power supply rails (e.g., $V_{DD}$ and ground), and a sense amp is utilized to latch the logic levels sensed on the bitlines after they are separated by a predetermined voltage difference, typically 10% or less of $V_{DD}$. Furthermore, the sense amp may be provided as a differential sense amp, with each of the memory cells driving both a data signal and a data-bar signal on the complementary bitlines (i.e., data lines) associated with each column. In operation, prior to activating the memory cells, the bitlines are precharged and equalized to a common value. Once a particular row and column are selected, the memory cell corresponding thereto is activated such that it pulls one of the data lines toward ground, with the other data line remaining at the precharged level, typically $V_{DD}$. The sense amp coupled to the two complementary bitlines senses the difference between the two bitlines once it exceeds a predetermined value and the sensed difference is indicated to the sense amp as the differing logic states of "0" and "1".

As the transistor device sizes continue to decrease, e.g., 0.13μ or smaller, several issues begin to emerge with respect to the operation of SRAM cells, chiefly because at such dimensions the devices suffer from high values of leakage in the off state in standby mode. Essentially, these devices are no longer ideal switches; rather they are closer to sieves, having a non-negligible constant current flow path from drain to source or from drain/source to substrate even in the off state. The high leakage causes two major problems. First, because of the generation of large static current as leakage, there is increased static power consumption as a result. Second, which is more serious, is the issue of incorrect data reads from the SRAM cells. The accumulated leakage current from all the bitcells in a selected column is now comparable to the read current, thereby significantly eroding the bitline differential required for reliable sensing operations.

A technique for reducing standby leakage currents in a SRAM cell is disclosed in a recent article titled "16.7*fA/cell Tunnel-Leakage-Suppressed 16 Mb SRAM for Handling Cosmic-Ray-Induced Multi-Errors*" by Kenichi Osada, Yoshikazu Saitoh, Eishi Ibe and Koichiro Ishibashi (in IEEE International Solid-State Circuits Conference, 2003, pages 302–303), where the source terminals of a plurality of SRAM cells on a single bitline column are coupled together for providing a biasing potential. Whereas such a scheme is seen to reduce total standby current, it does not improve the ratio of read current ($I_R$) to cell leakage current ($I_L$), however.

SUMMARY OF THE INVENTION

The present invention provides a wordline-based source-biasing scheme for SRAM in order to reduce leakage. In standby mode, wordlines are deselected and a source-biasing potential is provided to SRAM cells. In read mode, a selected wordline deactivates the source-biasing potential provided to the selected row of SRAM cells, whereas the remaining SRAM cells on the selected bitline column continue to be source-biased. Source-biasing potential may be provided by applying a select voltage to the source terminal of an SRAM cell or by appropriately biasing the body well potential thereof.

The main idea of the source-biasing scheme is to reduce the leakage across the access devices (or, pass gates) of a bitcell (i.e., memory cell). Since the leakage across the pass gate is due to $V_{DS}$ (=supply voltage), the present invention is directed to reducing it by raising the potential of ground node within the bitcell. Thus, in one implementation, the ground nodes (i.e., source terminals of the pull-down devices) of all bitcells in a row are connected together and maintained at around 100 to 300 millivolts, which can vary based on the cell technology, design rules, operating voltage, etc. When a wordline is turned on, the ground potential for that row is switched to 0 by using a wordline-activated multiplex switching mechanism. For bitcells with raised ground, on the other hand, the leakage is substantially reduced because of the biasing potential that continues to be maintained. Therefore, in one bitline column, only the bitcell being accessed will have leakage across the pass gate; all other cells will have significantly reduced leakage (due to their raised ground nodes) resulting in a read current that is significantly greater than any accumulated leakage.

In one aspect, the present invention is directed to an SRAM cell that is comprised of a pair of cross-coupled inverters forming a pair of data nodes. Each cross-coupled inverter includes a pull-up device and a pull-down device, wherein the pull-down device's source is biased by a select potential applied to a row of SRAM cells in which the SRAM cell is disposed. Also included in the SRAM cell are a pair of access devices, each being disposed between a respective data node and associated bitline, wherein gates of the access devices are operable to be driven by a wordline.

In another aspect, the present invention is directed to an SRAM instance that comprises a plurality of SRAM memory cells organized in an array having rows and columns. Each SRAM cell includes a pair of cross-coupled inverters that are coupled to form a pair of data nodes, wherein pull-down devices of the SRAM cells forming a row are coupled together to be biased by a bias potential in standby mode. A row decoder is provided for selectively activating wordlines based on a decoded address, wherein each wordline is operable to drive a corresponding row of the array. In addition, a multiplexer is disposed between the row decoder and the array for deactivating the bias potential provided to the SRAM cells of a particular row when that row is driven by a wordline associated therewith.

In a still further aspect, the present invention is directed to a memory compiler for compiling at least one SRAM memory instance. The memory compiler includes a code portion for generating a plurality of SRAM memory cells organized in an array having rows and columns. Each SRAM cell includes a pair of cross-coupled inverters that are coupled to form a pair of data nodes, wherein pull-down devices of the SRAM cells forming a row are coupled together to be biased by a bias potential in standby mode. A code portion is provided for generating a row decoder that is operable to selectively activate wordlines based on a decoded address, wherein each wordline is operable to drive a corresponding row of the array. In addition, another code portion is provided for generating a multiplexer that is disposed between the row decoder and the array for deactivating the bias potential provided to the SRAM cells of a particular row when that row is driven by a wordline associated therewith.

BRIEF DESCRIPTION OF THE DRAWINGS

A more complete understanding of the present invention may be had by reference to the following Detailed Description when taken in conjunction with the accompanying drawings wherein.

DETAILED DESCRIPTION OF THE DRAWINGS

Figure 1:
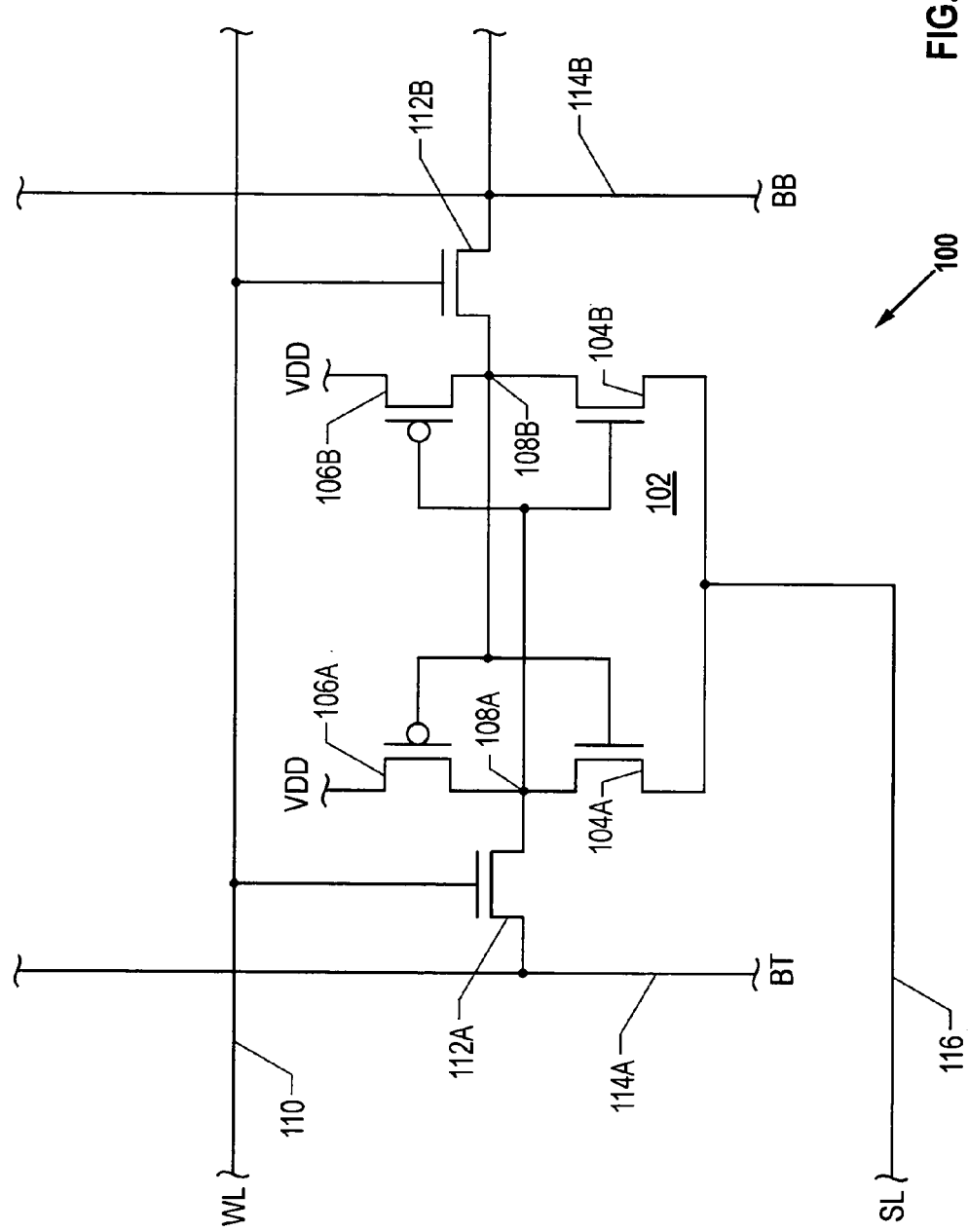
FIG. 1 depicts an exemplary embodiment of a source-biased SRAM cell in accordance with the teachings of the present invention.

In the drawings, like or similar elements are designated with identical reference numerals throughout the several views thereof, and the various elements depicted are not necessarily drawn to scale. Referring now to FIG. 1, depicted therein is an exemplary embodiment of a source-biased SRAM cell 100 in accordance with the teachings of the present invention where leakage is advantageously reduced without disturbing the integrity of stored data. As illustrated, SRAM cell 100 is provided with a pair of complementary bitlines, BT 114A and BB 114B where each of the complementary bitlines may be coupled to appropriate precharge circuitry (not shown in this FIG.) such that it is pulled to a power supply rail or a reference voltage source (typically $V_{DD}$ or any portion thereof) when the precharge circuitry is activated.

The memory cell, also referred to as bitcell, 100 is comprised of a 4T-CMOS latch 102 that includes a pair of cross-coupled inverters to form a pair of data nodes 108A and 108B. A first P-channel field effect transistor (P-FET) 106A operating as a pull-up device of one of the inverters has its source/drain terminals connected between $V_{DD}$ and a first data node 108A, with the gate thereof connected to a second data node 108B. As is well known, the data nodes 108A and 108B operate as the two complementary storage nodes in the memory cell 100. An N-channel FET (N-FET) 104A operating as a pull-down device has its drain connected to the data node 108A and its source connected to a wordline-based source bias control line (SL) 116 that is switchably connected to a bias potential as will be described in greater detail hereinbelow. The gate of N-FET 104A is coupled to the second data node 108B. With respect to the other inverter, a second P-FET 106B is operable as a pull-up device having its source/drain terminals connected between $V_{DD}$ and the data node 108B, with the gate thereof connected to the data node 108A. A second N-FET 104B is operable as a pull-down device wherein the drain is coupled to the data node 108B and the source is commonly connected to the source bias control line 116.

A first N-FET access device 112A is disposed between BT 114A and the data node 108A, with the gate thereof coupled to a wordline (WL) 110. In similar fashion, a second N-FET access device 112B has the source/drain thereof connected between BB 114B and the data node 108B, wherein its gate is also driven by WL 110. The cross-coupled inverters of the memory cell form latch 102, where nodes 108A and 108B are operable to hold logic levels that correspond to stored data.

Initially, in one embodiment of a memory standby mode, WL 110 is held low and the precharge circuitry associated with the bitlines is activated so as to pull the bitlines to a predetermined high voltage. Further, SL 116 is raised to a select potential (having a range approximately from around 100 millivolts to 300 millivolts, the value being determined such that the logic levels that correspond to stored data at nodes 108A and 108B are not disturbed, which depends on the SRAM cell technology, operating voltage levels, device sizing, et cetera). Because of the biasing of the sources of the N-FET pull-down devices 104A and 104B by SL 116, the leakage current through access devices 112A and 112B is significantly reduced. Since leakage in each bitcell on a select bitline column is accordingly reduced, the cumulative leakage current in a select bitline is also reduced such that the read current margin that is developed on that bitline when any WL is driven high to select a bitcell thereon is not eroded. That is, by way of example, the precharge circuitry (not shown) is turned off during a read operation and WL 110 is activated (based on address decoding) so as to turn on the access transistors 112A and 112B. Accordingly, the data node 108A is coupled to BT 114A and the data node 108B is coupled to BB 114B. If, for example, a logic "0" was stored on the data node 108A and a logic "1" was stored on the data node 108B, N-FET 104A would be turned on and N-FET 104B would be turned off. As will be described in additional detail below, a multiplexing mechanism is provided for deactivating the source biasing potential applied via SL 116 to the N-FET devices of a selected bitcell during a read operation. Thus, N-FET 104A would pull BT 114A low, whereas BB 114B would swing to a voltage level based on the logic "1" of the data node 108B, thereby developing the bitline differential operable to drive appropriate sense amp circuitry for reading data.

Figure 2:
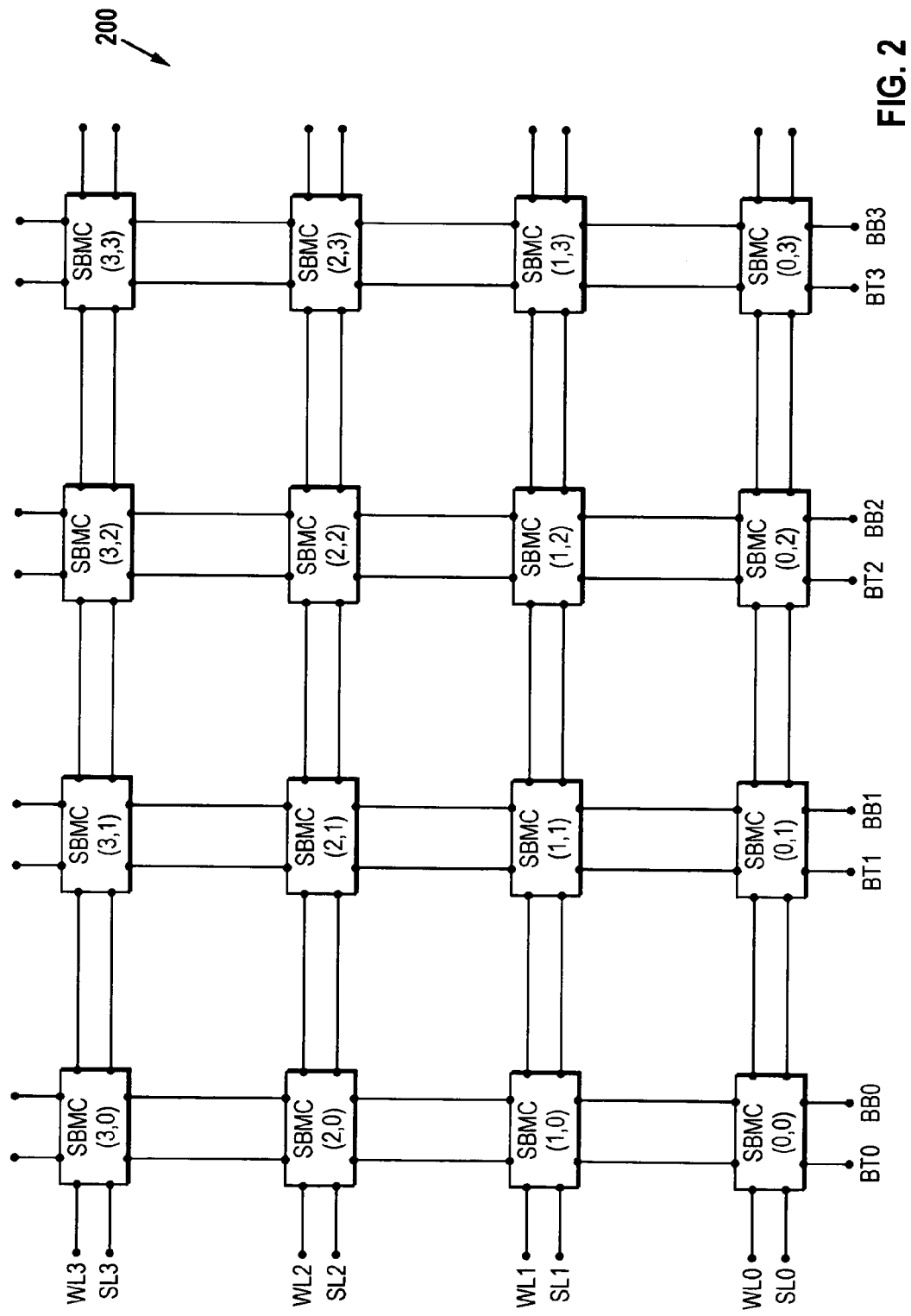
FIG. 2 depicts an exemplary memory array portion comprising source-biased SRAM cells according one embodiment of the present invention.

FIG. 2 depicts an exemplary SRAM array portion 200 comprising source-biased memory cells (SBMCs) according one embodiment of the present invention. As illustrated, 16 bitcells, SBMC(0,0) to SBMC(3,3), are disposed in a 4-by-4 array, where bitcells of each row are provided with a commonly coupled SL control line along with the associated WL corresponding to the row. In FIG. 2, SL0 to SL3 exemplify four commonly coupled source bias control signal lines, each operating with respect to a particular row of bitcells. As a further variation, it should be apparent that a biasing potential may also be provided by appropriately biasing the body well potential of the SBMCs, e.g., by controlling the VBS potential between an N-FET pull-down device's source and its p-well body.

Figure 3:
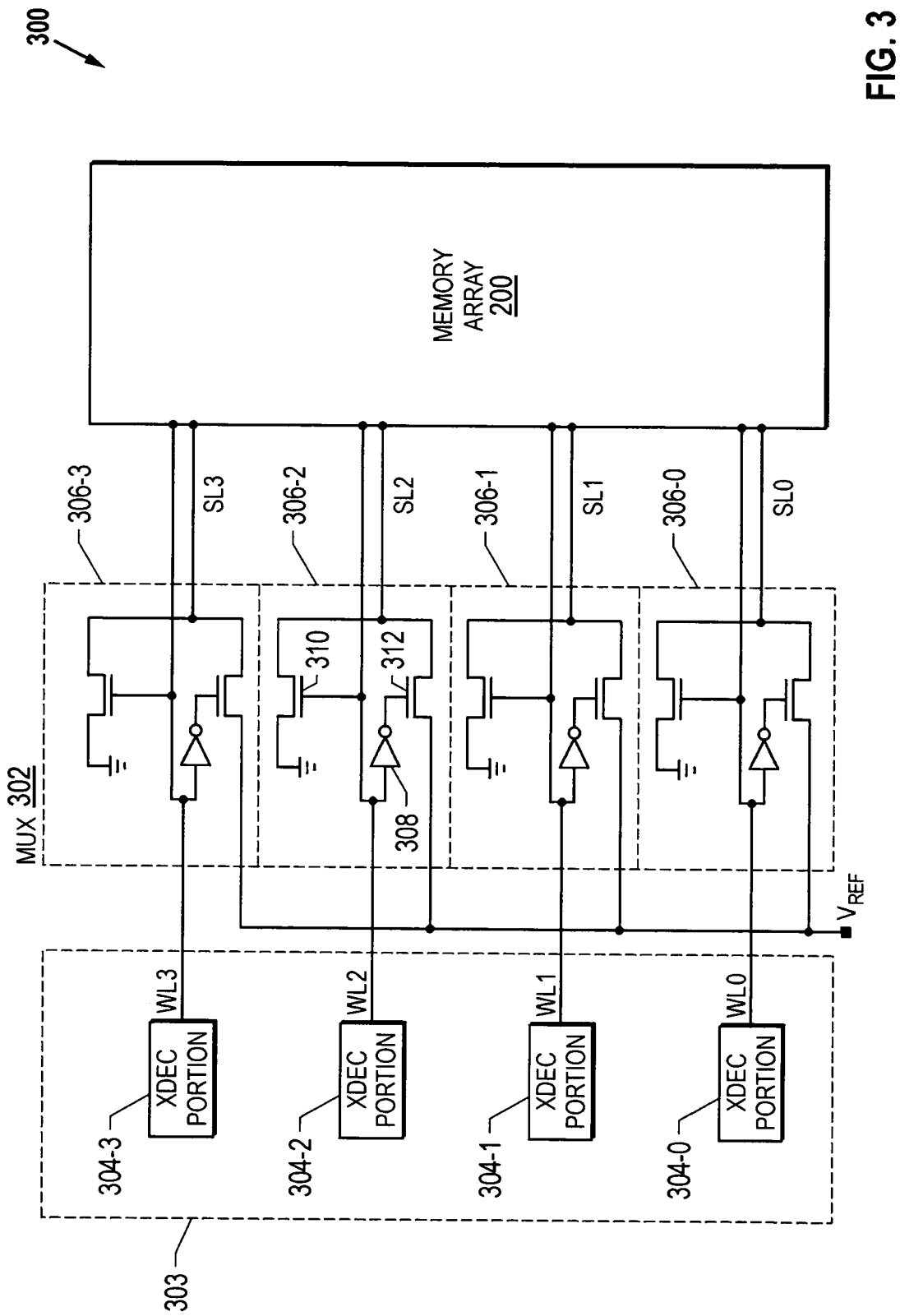
FIG. 3 depicts an exemplary embodiment of an SRAM instance that includes a wordline multiplexer (MUX) circuit for use with the memory array shown in FIG. 2 for effectuating leakage reduction therein in accordance with the teachings of the present invention.

Referring now to FIG. 3, depicted therein is an exemplary embodiment of an SRAM instance 300 that includes a wordline multiplexer (MUX) circuit 302 for use with the memory array portion 200 shown in FIG. 2 for effectuating leakage reduction therein in accordance with the teachings of the present invention. Row decoder (XDEC) 303 including XDEC portions 304-0 to 304-3 is operable responsive to row address signals provided by a control block (not shown in this FIG.) so as to activate a select WL, i.e., WL0 through WL3. The MUX circuit 302 disposed between XDEC 303 and memory array 200 is operable to deactivate a source bias potential ($V_{REF}$ that is normally coupled to SL0–SL3 in standby) provided to a particular row of bitcells when that row is driven (i.e., selected) by a wordline associated therewith.

In the illustrated embodiment, MUX 302 is comprised of a plurality of bias switch elements 306-0 to 306-3, each corresponding to a particular WL. Each bias switch element includes logic circuitry driven by the corresponding WL to deactivate $V_{REF}$ from the associated SL when WL is driven high. This WL-based switching logic is particularly exemplified in the following with respect to bias switch element 306-2. In standby mode, WL2 is low (i.e., deselected) which turns off a pass gate 310, thereby decoupling SL2 from ground. Also, WL2 is operable to drive an inverter 308 to output a logic high which consequently turns on another pass gate 312, thereby coupling SL2 to $V_{REF}$. When WL2 is selected (i.e., driven high) in a read operation, the logic of the switch element 306-2 operates to turn on pass gate 310, thereby coupling SL2 to ground and to turn off pass gate 312, thereby decoupling SL2 from $V_{REF}$. Accordingly, only the row of bitcells associated with WL2 and SL2, i.e., SBMC(2,0), SBMC(2,1), SBMC(2,2), SBMC(2,3), have their source-biasing turned off during a read operation associated therewith.

Figure 4:
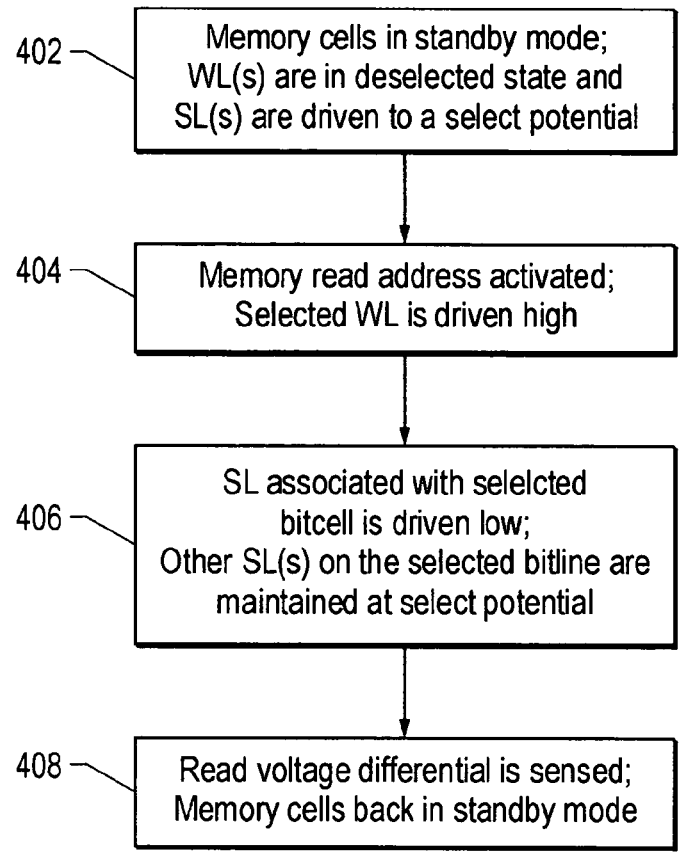
FIG. 4 is a flow chart of memory operations according to one embodiment of the present invention.

FIG. 4 is a flow chart of memory operations according to one embodiment of the present invention. As pointed out above, when the bitcells are in standby mode, the wordlines are in deselected state and SL control lines are driven to a select potential (block 402). When a memory read address is activated pursuant to a read operation, a selected WL (based on the decoded address) is driven high (block 404). Subsequently, MUX logic circuitry described above operates such that SL associated with row-selected bitcell is driven low, whereas SL control lines of the remaining bitcells on the selected bitline column (based on a column address) are maintained at the select potential (block 406). Upon sensing the read voltage differential developed on the selected bitline column as part of the read operation, the memory cells may revert to standby mode (block 408).

Figure 5:
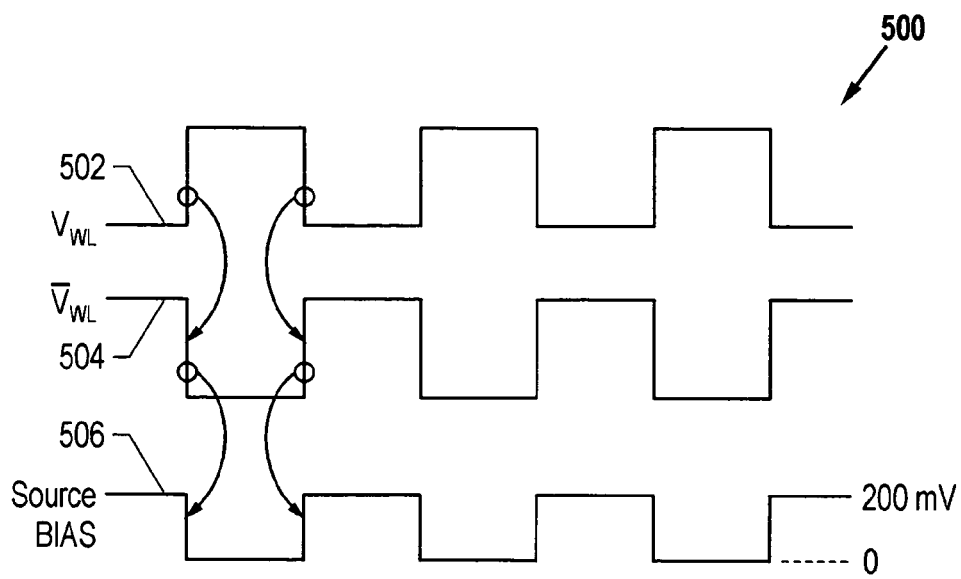
FIG. 5 depicts a set of waveforms relating to memory operations in accordance with one embodiment of the present invention.

FIG. 5 depicts a set of waveforms relating to memory operations in accordance with one embodiment of the present invention. Reference numeral 502 refers to the voltage level on a WL ($V_{WL}$) and reference numeral 504 refers to the inverted $V_{WL}$. As depicted, when there is a rising edge on $V_{WL}$, the inverted $V_{WL}$ is driven low to generate a falling edge therein. As a result, the source bias 506 is also driven low, whereupon normal read current is developed for sensing.

Figure 6A:
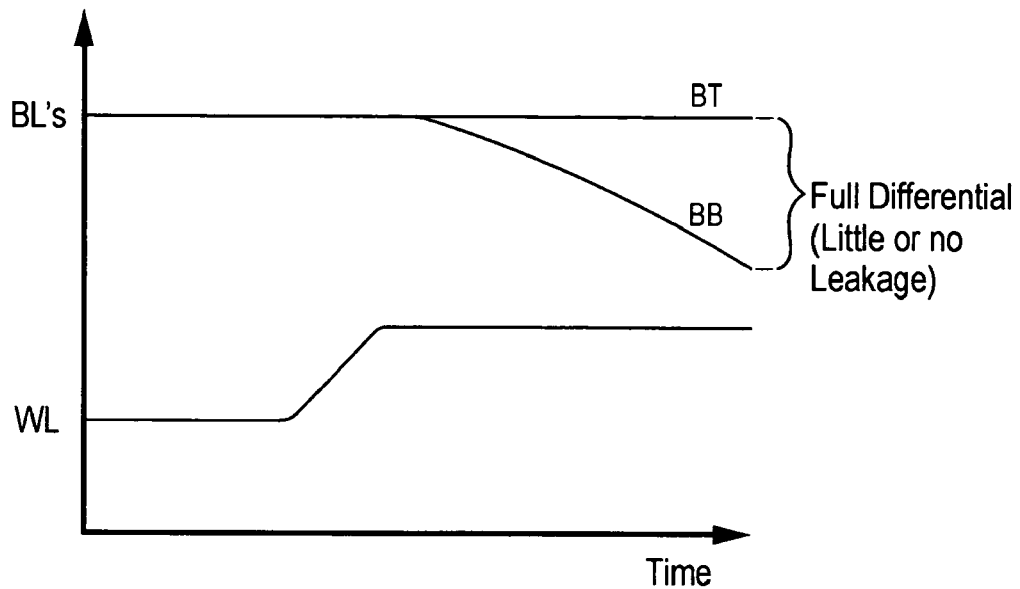
FIGS. 6A–6C depict a plurality of graphs for illustrating the restorative effect of wordline-based source biasing on the read current in accordance with the teachings of the present invention.
Figure 6B:
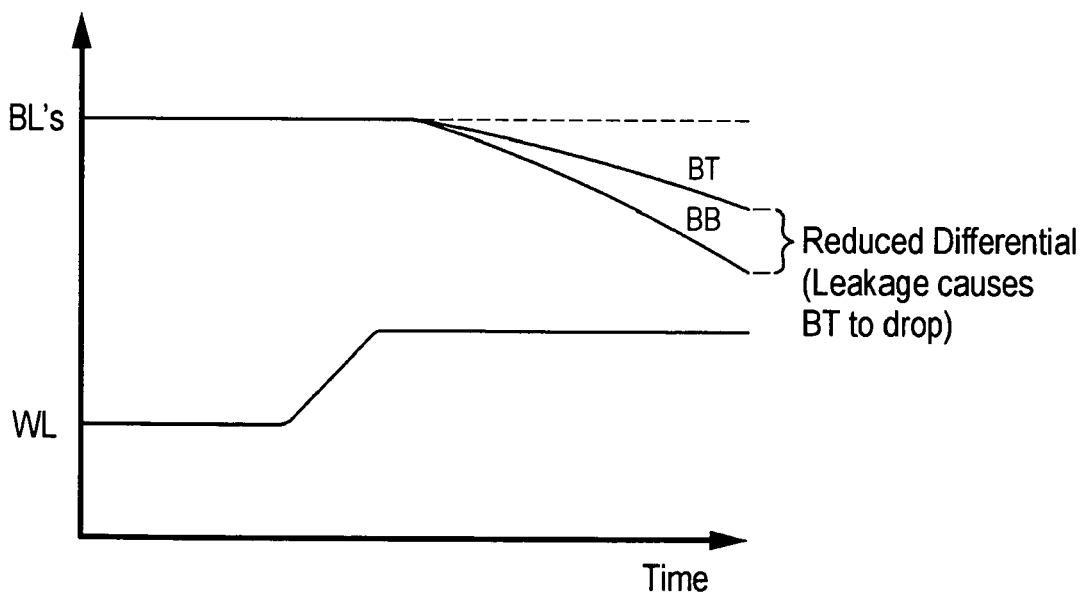
Figure 6C:
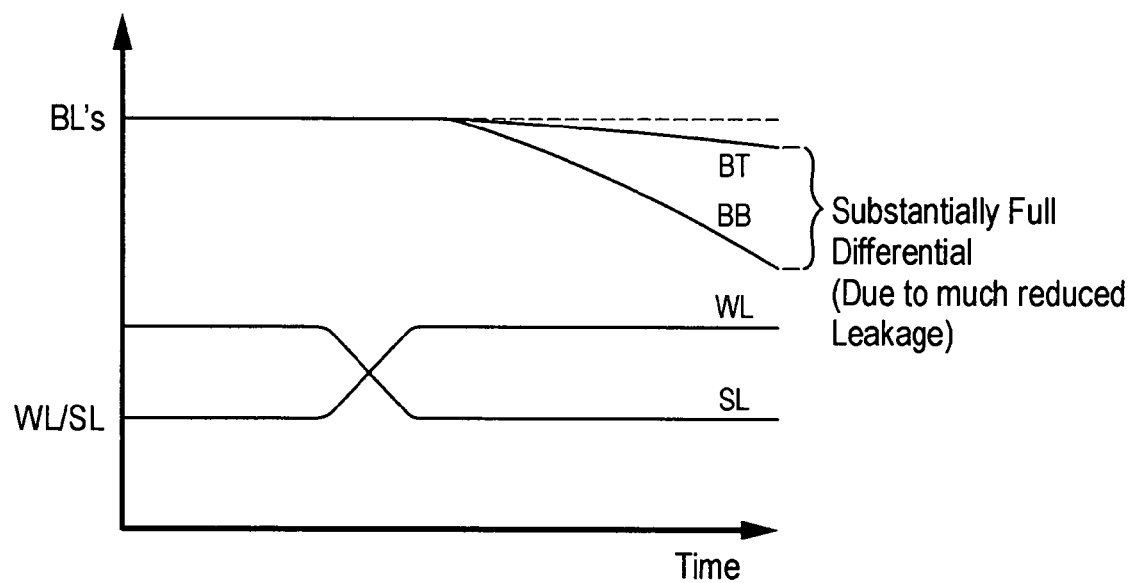

FIGS. 6A–6C depict a plurality of graphs for illustrating the restorative effect of wordline-based source biasing on the read current in accordance with the teachings of the present invention. In particular, FIGS. 6A and 6B illustrate the prior art conditions where there is either little or no leakage at all (due to legacy technology), or where there is a substantial leakage (due to shrinking geometries) that causes reduced bitline differentials. FIG. 6C illustrates the condition where the present invention advantageously restores the bitline differentials by substantially reducing the leakage current effect. By way of an example, consider where SRAM cell read current ($I_R$) is about 24 µA. Leakage current per unselected cell ($I_{LC}$) is deemed to be about 0.006 µA where the present invention's source-biasing technique is implemented. If there are 1000 cells per bitline, total contribution of all unselected cells ($I_{LT}$) would be about 6 µA (=0.006 µA×1000). The effective signal is therefore reduced by 25% (since $I_{LT}/I_R=6/24=1/4$). If SL is biased at around 300 mV according to the wordline-based source biasing scheme of the present invention, $I_{LC}$ is reduced to 0.000180 µA. Therefore, for 1000 cells/BL, $I_{LT}$=0.180 µA. Accordingly, there is less than 1% loss in the read current signal, thereby significantly improving memory access operations.

Based on the foregoing, it should be appreciated that the present invention provides a simple yet efficient and elegant leakage reduction scheme whereby cell read currents are not compromised as the memory cell technology evolves beyond the current designs of 0.13µ. Additionally, the wordline-based source biasing mechanism as disclosed herein is adaptable to different SRAM sizes, configurations, and device sizes, wherein source-bias potential levels may be appropriately selected so as not to have deleterious effects (e.g., with respect to the integrity of stored data). Those skilled in the art should also readily recognize upon reference hereto that source-biasing potential may be provided by applying a select voltage to the source terminal of an SRAM cell or by appropriately biasing the body well potential thereof. Furthermore, it should be apparent that the teachings of the present invention may be practiced in standalone SRAM devices as well as compilable SRAM applications having one or more SRAM instances.

It is believed that the operation and construction of the present invention will be apparent from the foregoing Detailed Description. While some aspects of the method and circuitry shown and described may have been characterized as being preferred, it should be readily understood that various changes and modifications could be made therein without departing from the scope of the present invention as set forth in the following claims.

What is claimed is:

1. A Static Random Access Memory (SRAM) instance, comprising:

a plurality of SRAM cells organized in an array having rows and columns, each SRAM cell including a pair of cross-coupled inverters that are coupled to form a pair of data nodes, wherein pull-down devices of said SRAM cells forming a row are coupled together to be biased by a bias potential in standby mode;

a row decoder for selectively activating wordlines based on a decoded address, wherein each wordline is operable to drive a corresponding row of said array; and a multiplexer disposed between said row decoder and said array for deactivating said bias potential provided to said SRAM cells of a particular row when said particular row is driven by a wordline associated therewith, wherein said multiplexer includes a plurality of bias switch elements, each corresponding to a wordline, said each bias switch element comprising logic circuitry driven by a corresponding wordline to deactivate said bias potential when said corresponding wordline is driven high.

2. The SRAM instance as set forth in claim 1, wherein said decoded address comprises a row address.

3. The SRAM instance as set forth in claim 1, wherein said pull-down devices of said SRAM cells comprise N-channel field-effect transistor (N-FET) devices.

4. The SRAM instance as set forth in claim 1, wherein said bias potential is approximately in a range of from about 100 millivolts to about 300 millivolts.

5. The SRAM instance as set forth in claim 1, wherein said bias potential is operable to preserve stability of logic levels stored at said data nodes of an SRAM cell.

6. The SRAM instance as set forth in claim 1, wherein said bias potential is applied by biasing a body well potential of said pull-down device.

7. The SRAM instance as set forth in claim 1, wherein said bias potential is selected to preserve stability of said SRAM cells.

8. The SRAM instance as set forth in claim 1, wherein said bias potential is applied by biasing said pull-down devices' respective source terminals.

9. A memory compiler for compiling at least one Static Random Access Memory (SRAM) memory instance, comprising:
   a code portion for generating a plurality of SRAM memory cells organized in an array having rows and columns, each SRAM cell including a pair of cross-coupled inverters that are coupled to form a pair of data nodes, wherein pull-down devices of said SRAM cells forming a row are coupled together to be biased by a bias potential in standby mode;
   a code portion for generating a row decoder that selectively activates wordlines based on a decoded address, wherein each wordline is operable to drive a corresponding row of said array; and
   a code portion for generating a multiplexer disposed between said row decoder and said array, said multiplexer for deactivating said bias potential provided to said SRAM cells of a particular row when said particular row is driven by a wordline associated therewith, wherein said multiplexer includes a plurality of bias switch elements, each corresponding to a wordline, said each bias switch element comprising logic circuitry driven by a corresponding wordline to deactivate said bias potential when said corresponding wordline is driven high.

10. The memory compiler for compiling at least one SRAM memory instance as set forth in claim 9, wherein said decoded address comprises a row address.

11. The memory compiler for compiling at least one SRAM memory instance as set forth in claim 9, wherein said pull-down devices of said SRAM cells comprise N-channel field-effect transistor (N-FET) devices.

12. The memory compiler for compiling at least one SRAM memory instance as set forth in claim 9, wherein said bias potential is approximately in a range of from about 100 millivolts to about 300 millivolts.

13. The memory compiler for compiling at least one SRAM memory instance as set forth in claim 9, wherein said bias potential is operable to preserve stability of logic levels stored at said data nodes of an SRAM cell.

14. The memory compiler for compiling at least one SRAM memory instance as set forth in claim 9, wherein said bias potential is applied by biasing a body well potential of said pull-down device.

15. The memory compiler for compiling at least one SRAM memory instance as set forth in claim 9, wherein said bias potential is selected to preserve stability of said SRAM cells.

16. The memory compiler for compiling at least one SRAM memory instance as set forth in claim 9, wherein said bias potential is applied by biasing said pull-down devices' respective source terminals.

17. A memory operation method associated with a Static Random Access Memory (SRAM) instance, said SPAM instance having a plurality of SRAM memory cells organized in an array having rows and columns, each SRAM cell including a pair of cross-coupled inverters that are coupled to form a pair of data nodes, comprising:
   in standby mode, providing a bias potential to pull-down devices of said SRAM cells that form a row of said array;
   selectively activating a wordline based on a decoded address for a memory read operation, said wordline for accessing a bitcell on a row of SRAM cells;
   responsive to activating said wordline, deactivating said bias potential from said pull-down devices of said row of SRAM cells;
   selecting a particular bitline column based on a column address;
   reading a data value stored at a select bitcell selected by said row address and said column address while continuing to activate said bias potential of remaining bitcells of said particular bitline column; and
   upon completion of said reading, re-activating said bias potential to said row of SRAM cells associated with said row address.

18. The memory operation method associated with an SRAM instance as set forth in claim 17, wherein said decoded address comprises a row address.

19. The memory operation method associated with an SRAM instance as set forth in claim 17, wherein said bias potential is approximately in a range of from about 100 millivolts to about 300 millivolts.

20. The memory operation method associated with an SRAM instance as set forth in claim 17, wherein said bias potential is applied by biasing a body well potential of said pull-down device.

21. The memory operation method associated with an SRAM instance as set forth in claim 17, wherein said bias potential is selected to preserve stability of said SRAM cells.

22. The memory operation method associated with an SRAM instance as set forth in claim 17, wherein said bias potential is applied by biasing said pull-down devices' respective source terminals.

23. A Static Random Access Memory (SRAM) circuit, comprising:
   a plurality of SRAM cells organized in an array having rows and columns, wherein pull-down devices of said SRAM cells forming a row are biased by a bias potential; and
   a plurality of bias switch elements, each corresponding to a wordline associated with a row of said array, said each bias switch element comprising logic circuitry driven by a corresponding wordline to deactivate said bias potential when said corresponding wordline is driven high.

24. The SRAM circuit as set forth in claim 23, wherein said plurality of bias switch elements form a multiplexer disposed between said array and a row decoder, said row decoder for selectively activating wordlines based on a decoded row address, wherein each wordline is operable to drive a corresponding row of said array.

25. The SRAM circuit as set forth in claim 23, wherein said pull-down devices of said SRAM cells comprise N-channel field-effect transistor (N-FET) devices.

26. The SPAM circuit as set forth in claim 23, wherein said bias potential is approximately in a range of from about 100 millivolts to about 300 millivolts.

27. The SPAM circuit as set forth in claim 23, wherein said bias potential is operable to preserve stability of logic levels stored at data nodes of an SRAM cell.

28. The SRAM circuit as set forth in claim 23, wherein said bias potential is applied by biasing a body well potential of said pull-down device.

29. The SRAM circuit as set forth in claim 23, wherein said bias potential is selected to preserve stability of said SRAM cells.

30. The SRAM circuit as set forth in claim 23, wherein said bias potential is applied by biasing said pull-down devices' respective source terminals.

* * * * *